United States Patent [19]

Bourdelaise et al.

[11] Patent Number: 5,109,320
[45] Date of Patent: Apr. 28, 1992

[54] SYSTEM FOR CONNECTING INTEGRATED CIRCUIT DIES TO A PRINTED WIRING BOARD

[75] Inventors: Robert A. Bourdelaise, Crofton; Denise B. Harris; David B. Harris, both of Columbia; Victor J. Brzozowski, Severn, all of Md.

[73] Assignee: Westinghouse Electric Corp., Pittsburgh, Pa.

[21] Appl. No.: 632,785

[22] Filed: Dec. 24, 1990

[51] Int. Cl.$^5$ ............................................... H05K 7/20
[52] U.S. Cl. ................................... 361/413; 361/387; 361/401; 428/901; 439/66
[58] Field of Search ............... 361/381, 382, 386, 387, 361/388, 389, 396, 398, 400, 401, 403, 410, 412, 413; 439/65, 66, 68, 70, 71, 73; 165/80.3, 185; 174/52.2, 52.4, 252, 260, 261; 428/901

[56] References Cited

U.S. PATENT DOCUMENTS

| | | | |
|---|---|---|---|
| 3,904,934 | 9/1975 | Martin | 361/412 |
| 4,581,679 | 4/1986 | Smolley | 361/395 |
| 4,597,617 | 7/1986 | Enochs | 361/398 |
| 4,871,317 | 10/1989 | Jones | 439/68 |
| 4,885,662 | 12/1989 | Bartholomew | 361/413 |
| 4,922,378 | 5/1990 | Malhi | 361/387 |
| 4,933,305 | 6/1990 | Kikkawa | 437/211 |
| 4,933,808 | 6/1990 | Horton et al. | 361/336 |

Primary Examiner—Gerald P. Tolin
Attorney, Agent, or Firm—J. L. Brzuszek

[57] ABSTRACT

Both a system and a method are provided for electrically and mechanically connecting at least one integrated circuit die to a solderless printed wiring board of the type which uses connecting interfaces which include an array of resilient electrical connector means held within a sheet of compliant, insulating material. The system of the invention generally comprises a fanout interface formed from a sheet of insulating material integrally connected to the side of an integrated circuit die that includes the bond pads associated with such dies, wherein the fanout interface includes an internal array of contact pads that are connected to the bond pads of the die, and an external array of contact pads on its exterior surface which are advantageously spaced farther apart than the bond pads of the die. The system further comprises a connecting interface having an array of resilient electrical connectors disposed between the external surface of the fanout interface of the die, and an array of contact pads mounted directly on the printed wiring board. Finally, a screw-type heat conductive retainer is provided in order to compress the resilient electrical connectors of the connecting interface into conducting engagement between the contact pads on the fanout interface and the printed wiring board.

27 Claims, 7 Drawing Sheets

SYSTEM FOR CONNECTING INTEGRATED CIRCUIT DIES TO A PRINTED WIRING BOARD

BACKGROUND OF THE INVENTION

This invention generally relates to solderless printed wiring board modules, and is specifically concerned with an improved system and method for electrically, mechanically and thermally connecting at least one integrated circuit die to a printed wiring board which utilizes a fanout interface integrally connected to the die.

Solderless printed wiring board modules are known in the prior art. Such modules comprise a printed wiring board (PWB) having one or more arrays of contact pads (known as "footprints" in the art), a heat conductive guide plate assembly having a plurality of apertures that are registerable with the pattern of contact pad arrays on the PWB, each aperture being matable with an electrical component, and a connecting interface formed from a piece of compliant, insulating sheet material that is receivable within one of the apertures of the guide plate assembly. The interface includes a plurality of resilient electrical connectors (called "button connectors" in the art) that are registerable with the contact pads of the PWB when the connecting interface is dropped into one of the apertures of the guide plate assembly. Each of these button connectors is formed from a small, springy cylinder of randomly compressed, thin gauge copper-beryllium wire that has been gold plated. Each of these connectors is frictionally received within a through-hole present in the sheet material of the interface.

In operation, the interface is first dropped into one of the apertures of the guide plate assembly. The shape of the outer edge of the compliant sheet material forming the interface is matable within the aperture in the guide plate assembly, and the button connectors are registerable with the contact pads of the PWB such that the lower end of each of the connectors engages one of the pads in the PWB. An electrical component is next dropped into the aperture of the guide plate. This component is typically an integrated circuit die that has been hermetically sealed within a ceramic package housing having an external array of contact pads on its bottom surface. The shape of the outer edge of the electrical component is likewise matable with the aperture in the guide plate assembly such that its contact pads become aligned with the upper ends of the button connectors held by the sheet material of the connecting interface. When the electrical component is compressed downwardly toward the PWB by a slug retainer which screws into the upper end of the aperture, each of the resilient button connectors provides a positive, spring-loaded engagement between the pads of the PWB, and the corresponding external pads on the electrical component. Such a PWB module is disclosed and claimed in U.S. Pat. No. 4,933,808 invented by Messrs. Bourdelaise, David Harris and Roald Horton, and assigned to the Westinghouse Electric Corporation.

Such solderless PWB modules provide a great many advantages over conventional, soldered printed wiring board modules. The elimination of the soldering operation between the pads of the electrical components and the printed wiring board eliminates up to 67% of the required assembly time, and further greatly reduces the possibility of component damage due to overheating. Such solderless PWB modules may provide a higher degree of reliable interconnection between the electrical components and the printed wiring boards, as there is no possibility of defective connections occurring as a result of solder splattering or defective solder joints. Because of the need for inspecting finished solder joints, soldering encouraged perimeter-type connections to be made between the electrical component and the printed wiring board, where the finished connections could be seen. In instances where the electrical component had a large density of leads projecting out around its perimeter, the margin for error became very small for the proper soldering of each of these leads to its respective contact pad on the PWB as the distance between the leads became very small. By contrast, the advent of solderless PWB modules which utilizes a sheet-like connecting interface made it much more practical to spread these connections out in an area array pattern, where the connections are uniformly spaced apart from one another throughout the entire area under the component, as opposed to locating these connections only around the perimeter, thereby reducing the probability of an assembly error. Finally, such solderless PWB modules have much more effective heat sink properties than their prior art counterparts, and are far easier to test, repair and to replace components on.

Unfortunately, the applicants have observed that these last advantages of improved heat sink properties, ease of testing, and replacement of components are presently limited by the structure of present-day integrated circuits. Specifically, such circuits generally comprise a die formed from a silicon substrate which is hermetically sealed within a package housing. Presently, two configurations of such hermetically packaged integrated circuit dies are available, each of which has its advantages and disadvantages. These two types of packages integrated circuit dies are illustrated in cross-section on FIGS. 1 and 2, and are referred to in the art as "cavity down" and "cavity up" type integrated circuit packages, respectively. Each of these two types of packages 1 generally includes an integrated circuit die 2 formed from a rectangular substrate 3 of silicon that is received within a cavity 5 within a rectangular package housing 7. The rectangular substrate 3 forming the die 2 includes a metallized side 9 where all of the components of the integrated circuit are formed, as well as a heat transfer side 11 that is used to conduct away the heat generated by the circuit. Disposed around the edge of the metallized side 9 are a plurality of perimeter bond pads 13. These bond pads 13 are connected to an internal array 15 of contact pads disposed on a step-like structure that circumscribes the cavity 5 within the package housing 7. A plurality of fragile, hair-fine bond wires 17 interconnect the perimeter bond pads 13 with the internal array 15 of contact pads. The internal array 15 of contact pads is in turn interconnected to an external array 19a, 19b of contact pads disposed on the side of the package housing 7 that ultimately engages the "footprint" of contact pads on the PWB. In both of these packages 1, the cavity is hermetically sealed off by means of a metallic lid 21 held thereon by a bonding strip 23.

In the "cavity down" configuration illustrated in FIG. 1, the heat transfer side 11 of the rectangular substrate 3 of the integrated circuit die 2 is advantageously directly bonded to the ceiling of the cavity 5, which in turn affords a relatively short thermal path for the heat generated by the circuit. However, since the external array of contact pads 19a must be placed around the opening in the package housing 7 leading into the cavity 5, these contact pads 19a must be arranged in perimeter fashion. Such a perimeter arrangement of the contact pads 19a not only disadvantageously increases the size of the footprint area necessary for the corresponding contact pads on the PWB; it further disadvantageously crowds the contact pads 19a, thus lowering the margin of manufacturing error which can be tolerated, and enhancing the chances for an inadvertent short circuiting to take place between adjacent pads 19a. By contrast, the "cavity up" circuit package 1 illustrated in FIG. 2 can advantageously arrange its external array of contact pads 19b into an area-type configuration, as all of the cavity floor is available for this purpose. However, it does so at the expense of diminished thermal transfer ability, as it is difficult, if not impossible not to leave at least some kind of air gap between the upper surface of the substrate 3 of the die 2, and the metallic lid 21. Such spacing is necessary to insure that no short circuiting or external shock or stress will occur between or on the bond wire 17. Other problems associated with the package housing 7 used in the prior art include the extra size and weight that such housings impose on the integrated circuit dies 2, as well as the difficulty of repairing or replacing such a die 2 within such a housing 7, which requires the removal of the bonded lid 21 and the severing and replacement of the hair-fine bond wire 17. This last problem is a particularly expensive one in a case where several dies are contained within a single package housing to form a circuit sub-assembly, where the malfunction of a single die often causes the entire sub-assembly to be scrapped.

Clearly, what is needed is a system and method for mechanically and electrically connecting an integrated circuit die to a printed wiring board through an area-type arrangement of contact pads, but which has all of the desirable thermal dissipation characteristics of a cavity down-type integrated circuit package. Ideally, the size and weight of the package housing would be little bigger than the integrated circuit die itself, to provide the smallest and most lightweight solderless PWB module possible. Finally, in the case where several integrated circuit dies are enclosed within a single package housing, it would be desirable if some sort of means were provided for quickly and easily gaining access to and replacing one or more of the dies so that repairs might be easily made on such subassemblies.

SUMMARY OF THE INVENTION

Generally speaking, the invention is an improved system for electrically and mechanically connecting at least one integrated circuit die to a printed wiring board that eliminates or at least ameliorates the aforementioned problems associated with the prior art. More specifically, the system comprises a fanout interface having inner and outer interconnected arrays of contact pads on first and second sides, respectively, wherein the inner array is registerable with and integrally connected to the bond pads of the die, and the outer array has a greater pitch or average distance between contact pads than the first array. The system further comprises a connecting interface that includes an array of resilient electrical connectors for electrically connecting the outer array of the fanout interface to another array of contact pads that are electrically connected to the printed wiring board, and a means for compressing the resilient connector means in the conductive engagement between the outer and other array of contact pads.

The system is used in combination with a guide board assembly mounted over a printed wiring board which includes a plurality of component-receiving apertures, wherein each aperture is disposed over a "footprint" type contact pad array that is directly mounted on the printed wiring board.

The system may further include a means for hermetically sealing the metallization on the integrated circuit die from ambient moisture. Such hermetic sealing means may take the form of either a passivation coating that is applied between the die and the fanout interface, or a package housing having a cavity on one side for receiving the integrated circuit die. When a passivation coating is used, the integrated circuit die may advantageously be directly electrically and mechanically connected to the printed wiring board by merely stacking the aforementioned connecting interface and the fanout interface of the die within an aperture in the guide plate assembly, and then mounting a retainer means over the aperture to compress the resilient electrical connectors of the connecting interface into conducting engagement between the "footprint" of pads on the printed wiring board and the external contact pad on the fanout interface integrally connected to the die. The absence of a housing around the integrated circuit die also advantageously facilitates the transfer of heat away from the die. When a package housing is used, the housing includes an internal contact pad array that is registerable with the outer contact pads of the fanout interface, and a conductive interface is disposed between the two arrays of pads. A heat conductive spacer and lid are mounted over the open end of the cavity to compress the resilient electrical connectors of the conductive interface into conductive engagement between the external array of pads on the fanout interface, and the internal array of pads on the cavity surface. Next, both a second conducting interface and the package housing are stacked within one of the apertures of the guide plate, and a slug retainer is secured over the aperture in order to compress the resilient connectors of the second connecting interface into electrical contact between the pads of the "footprint" of the printed wiring board, and the external pads on the package housing. This second form of the invention provides thermal transfer characteristics comparable to a "cavity down" housing configuration with the advantageous area array of contact pads associated with a "cavity up" configuration.

The system of the invention may also be used to electrically interconnect a plurality of integrated circuit dies into a sub-assembly and then to electrically and mechanically connect this sub-assembly onto a printed wiring board. This embodiment of the system comprises a fanout interface for each of the dies, each of which is integrally connected to the contact pad side of the die and which serves to provide an external array of contact pads for the die having a greater pitch or average distance than the bond pads of the die, an interconnection substrate having a first pattern of contact pads on a first side that is registerable with the external array of contact pads of each of fanout interfaces, a plurality of internal conductors for interconnecting the dies into a sub-assembly, and a second pattern of contact pads on a second side that is registerable with a set of contact pads mounted directly on the printed wiring board. A first connecting interface as previously described is disposed between the integrated circuit dies and the first side of the substrate, and a second connecting interface is disposed between the substrate and the printed wiring board. In this particular form of the invention, the fanout interfaces of one or more of the dies may extend beyond the sides of the dies in order to advantageously increase the pitch or average distance between the contact pads leading to the dies. Additionally, when dies having such extended fanout interfaces are placed adjacent to one another in the resulting sub-assembly, the extended portions of the fanout interfaces may be mutually shaped in a complimentary fashion so as to minimize the amount of area required for the resulting sub-assembly. Frame members may be used to rigidify the extended sections of the sheet material forming the fanout interfaces so that good, positive electrical contact is made at all points between the resilient electrical connectors of the connecting interfaces, and all portions of the fanout interfaces.

In the method of the invention, a fanout interface means is first constructed over the side of the integrated circuit die that includes the pattern of bond pads for the die. This is done by building up the bond pads by an additive plating process, applying a coating of hardenable dielectric material, using additive plating to create fanout traces and an external array of contact pads on this first coating of dielectric material after it hardens, wherein the contact pads are higher than the fanout traces, and then applying a second hardenable coating of dielectric material up to the height of the contact pads in order to bury the fanout traces in insulating material.

In the next step of the method, a connecting interface as heretofore described is provided between the contact pads of the die and a set of contact pads that are electrically connected to the printed wiring board.

Finally, the resilient electrical connectors within the connecting interface are compressed into conductive engagement between the die contact pads and the set of contact pads that are electrically connected to the printed wiring board.

All variations of both the system and method of the invention provide superior thermal transfer characteristics and better reliability over the prior art, and all of the embodiments where passivation coatings are used in lieu of a package housing to hermetically seal the integrated circuit die additionally provide a simpler, more direct and more compact means of electrically and mechanically connecting integrated circuit dies to printed wiring boards.

DETAILED DESCRIPTION OF THE PREFERRED EMBODIMENT

Figure 4:
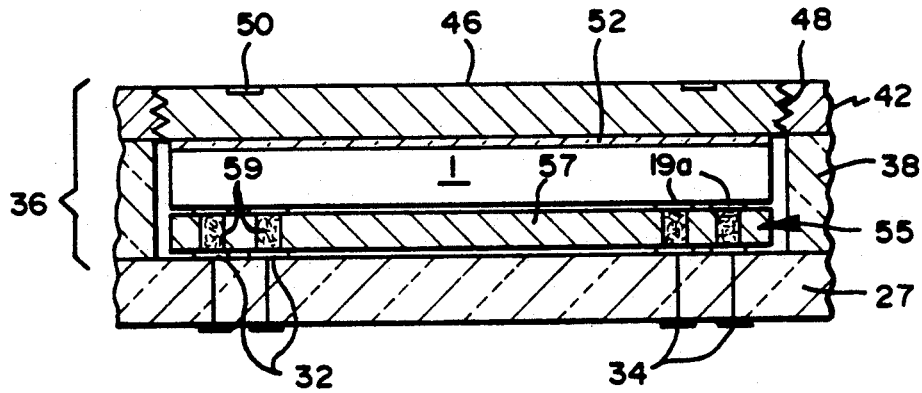
FIG. 4 is a cross-sectional side view of an integrated circuit package mounted within the PWB module illustrated in FIG. 3.
Figure 5:
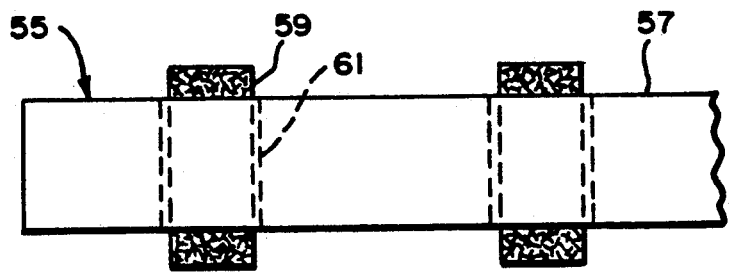
FIG. 5 is an enlarged, side view of a portion of the connecting interface used to electrically interconnect the contact pads of the integrated circuit package in the PWB board.
Figure 3:
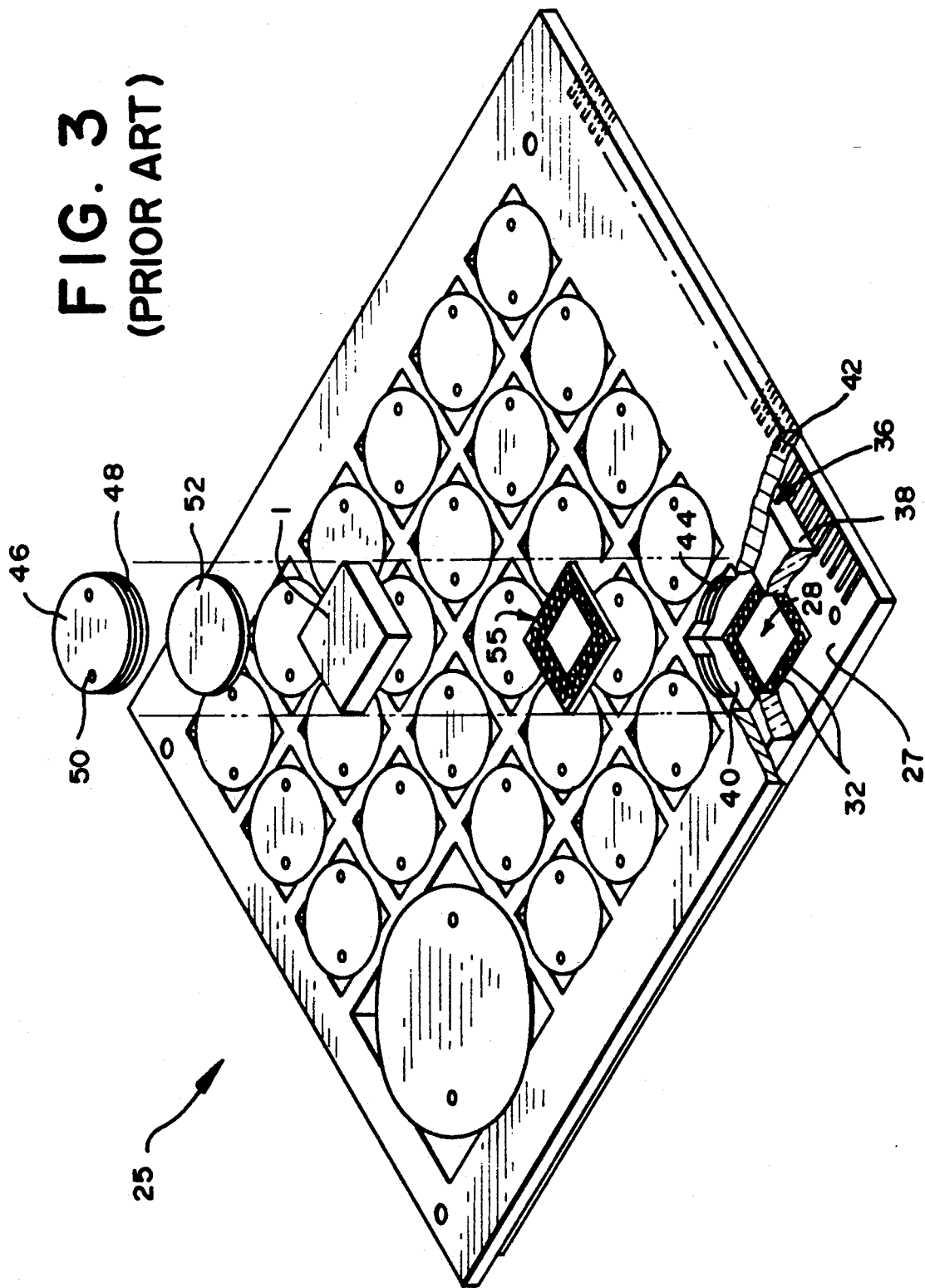
FIG. 3 is a perspective view of the type of PWB module that the system and the method of the invention may be used within, illustrating in exploded form how the various components of this module are assembled.

With reference now to FIGS. 3, 4 and 5, the purpose of the invention is to provide an improved system and method for electrically and mechanically connecting integrated circuit dies to PWB modules 25 so that all of the considerable advantages associated with such modules may be better realized.

Such modules 25 generally comprise a flat PWB board 27 having a plurality of arrays 28 of connector pads 32 on its upper surface for electrically engaging a corresponding array of pads on an electrical component, which may be the pads 19a of the previously discussed integrated circuit package 1. Such boards 27 further include a plurality of arrays of component test pads 34 on their lower surfaces which are connected to the pads 32 on their upper surfaces. The purpose of the test pads 34 is to allow a technician to easily test the operability of an electrical component 1 mounted within the module 25 without the need for disassembling the module 25 and removing the component 1 to be tested. While not specifically illustrated in any of the drawings, it should be noted that the PWB board 27 often includes a three-dimensional arrangement of conductive elements that are encased in the matrix of insulating material that forms the board 27. These unshown connector components interconnect the various electrical components 1 mounted on the board 27 in accordance with a desired circuit scheme.

A guide plate assembly 36 is mounted over the upper surface of the PWB board 27 for both aligning and securing the electrical components 1 over the various arrays 28 of PWB connector pads 32. The guide plate assembly 36 is provided with an alignment plate 38 that is directly to the upper face of the PWB board 27 and which includes a plurality of apertures 40 which are matable with the electrical components 1 to be connected to the board 27. The alignment plate 38 is preferably formed from a non-electrically conductive plastic material. The guide plate assembly 36 further includes a heat dissipation plate 42 that is mounted over the upper surface of the alignment plate 38 as shown. The heat dissipation plate 42 includes openings 44 which are threaded around their inner peripheries and that are registerable with the apertures 40 of the plate 38 and capable of matably receiving an electrical component 1. The plate 42 is preferably formed from aluminum. To mount an electrical component 1 over an array 28 of connector pads 32, the PWB module 25 is further provided with a slug retainer 46 having a threaded edge which screws into the threaded openings 44 of the heat dissipation plate 42. The upper surface of the slug retainer 46 has a pair of wrench receiving bores 50 which receive the prongs of a spanner wrench so that the slug 46 may be screwed into snug engagement with a thermally conductive spacer 52 to ensure good thermal contact between the component 1, and the slug retainer 46.

With specific reference now to FIGS. 4 and 5, a connecting interface 55 is provided in the PWB modules 25 of the prior art for effecting a positive, spring-loaded contact between the connector pads 32 of the PWB board 27 and the pads 19a of the electrical component 1. To this end, the connecting interface 55 includes a sheet member 57 formed from a section of compliant, insulating sheet material that is matable within the aperture 40 of the alignment plate 38. The compliant nature of the sheet member 57 helps the connecting interface 55 to accommodate small non-planarities which may exist between the connector pads 32 on the PWB board 27, and the connector pads 19a of the electrical component 1. To electrically connect these pads 32, 19a the sheet member 57 is provided with an array of resilient electrical connectors known as "button connectors" 59 which are frictionally held within bores 61 that extend through the thickness of the sheet member 57. The bores 61 which receivably secure the button connectors 59 are, of course, arranged in the same pattern as the pads 32, 19a on the PWB board 27 and the electrical component 1. The button connectors 59 themselves are formed from a cylinder of very fine, gold-plated copper-beryllium wire that has been "wadded up" to create a cylindrical structure formed from "kinked" wire having some amount of air space between the kinks. The air spaces between the cylindrical structure forming the connector buttons 59 allow for further compression of these structures, and the resilient nature of the kinks of copper-beryllium wire affords resiliency to the cylindrical structure that forms each of the button connectors 59.

In operation, the connecting interface 55 is dropped through the aperture 40 of the alignment plate 38, and an electrical component 1 is dropped in place over the interface 55 in the position illustrated in FIG. 4. The thermally conductive spacer 52 is placed over the upper surface of the electrical component 1, and the technician screws the slug retainer 46 into the threaded opening 44 of the heat dissipation plate 42 until the springy button connectors 59 held by the sheet member 57 are compressed into the retaining bores 61, thereby creating the desired, spring-loaded engagement between the pads 32 of the PWB board 27 and the pads 19a of the electrical component 1.

Figure 1:
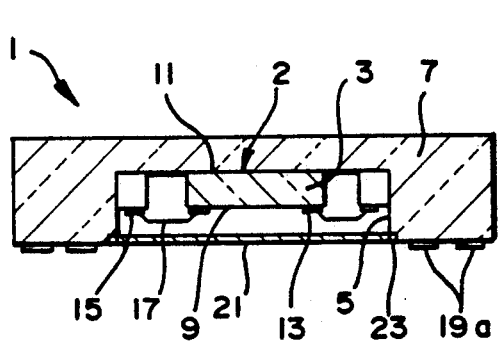
FIG. 1 is a cross-sectional side view of a prior art integrated circuit package arranged in a "cavity down" configuration.
Figure 2:
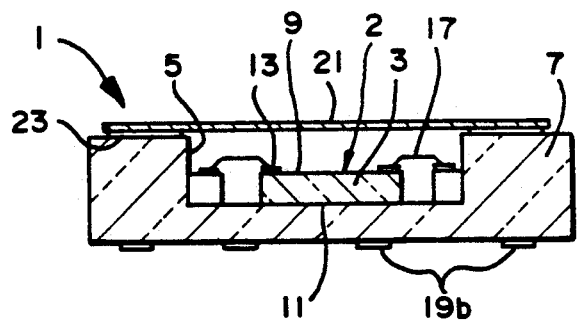
FIG. 2 is a cross-sectional side view of an integrated circuit package arranged in a "cavity up" configuration.
Figure 7:
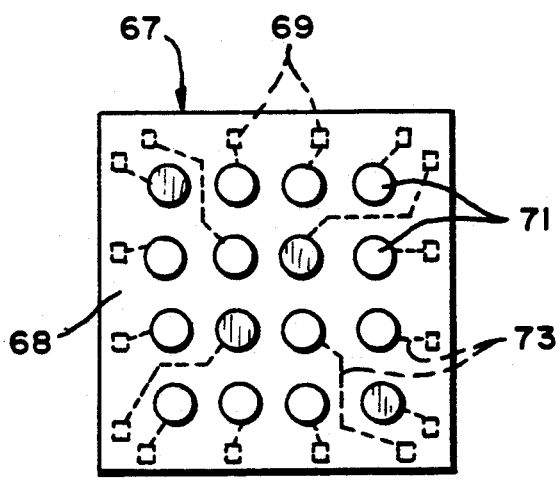
FIG. 7 is a plan view of a fanout interface as it would appear mounted over the surface of the die illustrated in FIG. 6.
Figure 6:
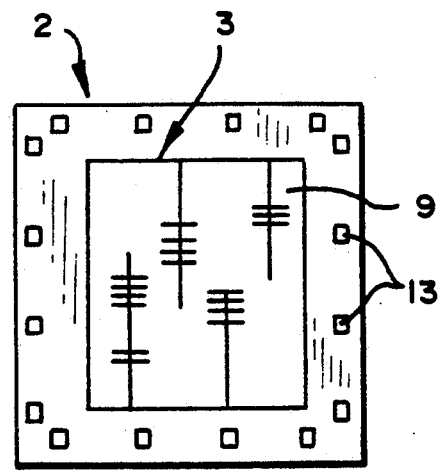
FIG. 6 is a plan view of an integrated circuit die, illustrating the metallization between the components of the circuit in the center portion of the die, and the bond pads arranged around the perimeter of the die.
Figure 8:
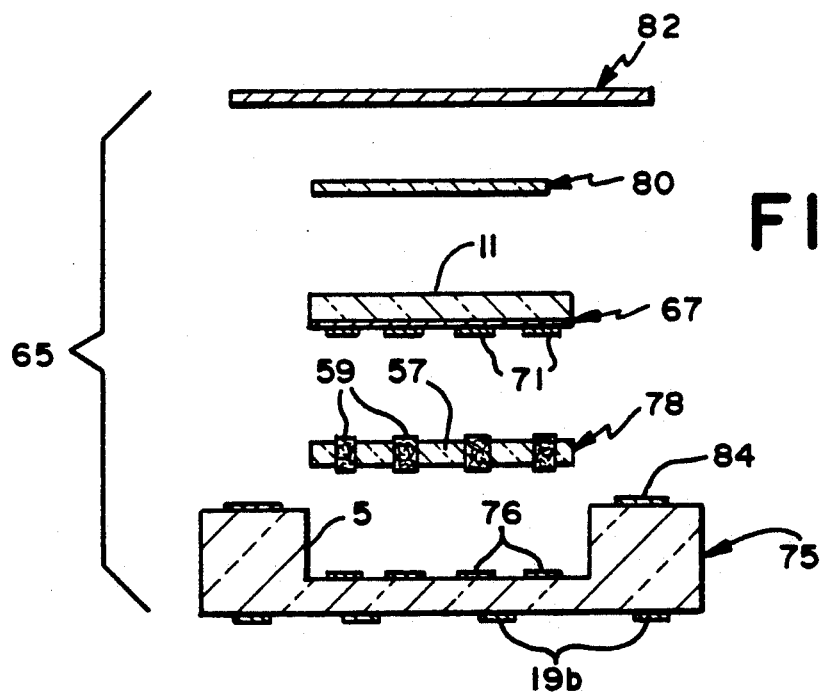
FIG. 8 is a cross-sectional, exploded side view of a novel integrated circuit package that makes use of the system of the invention, wherein a fanout interface is integrally connected to the circuit die and the contact pads of the die and the package housing are interconnected by means of a connecting interface.

With reference now to FIGS. 6, 7 and 8, the first embodiment of the invention is a novel integrated circuit package 65 which has all of the heat dissipating advantages of the prior art package illustrated in FIG. 1, in combination with the area array-type contact pads 19b illustrated in FIG. 2. This integrated circuit package 65 includes an integrated circuit die 2 onto which a fanout interface 67 has been applied over the metallized side 9 of the rectangular substrate 3 that forms the die 2. The fanout interface 67 advantageously converts the perimeter array of bond pads 13 normally present on the metallized side 9 of the die 2 into an area array of pads wherein both the size of the pads and the distances between them are significantly greater. To this end, the fanout interface 67 includes a sheet 68 of dielectric material having an internal array of pads 69 (illustrated in phantom) which are metallurgically bonded with the perimeter array of bond pads 13 present around the metallized side 9 of the integrated circuit die 2, along with an external array of pads 71 as shown. Each of the external array of pads 71 is connected to one of the internal array of pads 69 by way of fanout traces 73 (again shown in phantom).

The fanout interface 67 is integrally formed over the metallized side 9 of the integrated circuit die 2 by means of a liquid dielectric/additive plating process. This process may best be understood with reference to FIG. 10. In the first step of this process, the height of each of the perimeter bond pads 13 is extended by additively plating a conductive metal, such as copper, over each of the bond pads 13. This may be done by applying a photoresist material of a type known in the art over the metallized side 9 of the integrated circuit die, and by further applying a mask over each of the locations of the perimeter bond pads 13. The photoresist is then exposed to ultraviolet light, and the undeveloped resist over each of the perimeter bond pads 13 is then chemically removed in order to expose the top surface of each of these pads 13. The height of these pads 13 are then extended by electroplating copper over each of the exposed bond pads 13. The balance of the photoresist is then stripped away, and the metallized side 9 is then flooded with a hardenable, liquid dielectric to form a bottom layer 74a of dielectric. After this layer 74a of dielectric material hardens, it is polished so that only the upper surfaces of the newly created internal array of pads 69 (which are integrally connected to the perimeter bond pads 13) are exposed. This polished surface is then completely overplated with copper, and the fanout traces 73 are formed by conventional photoresist, masking and etching techniques. Finally, the external array of pads 70 is built upon the free ends of each of the fanout traces 73 again by the application of a photoresist, the masking and removal of a portion of this resist over each of the free ends of the tracers 73 and by the additive electroplating of copper over these free ends. This photoresist is then stripped, and the external side of the half-formed fanout interface 67 is again flooded with hardenable dielectric material to form a second upper layer 74b of dielectric, which is again polished after the dielectric material hardens in order to expose the upper surfaces of the newly formed external array of pads 71.

Figure 9:
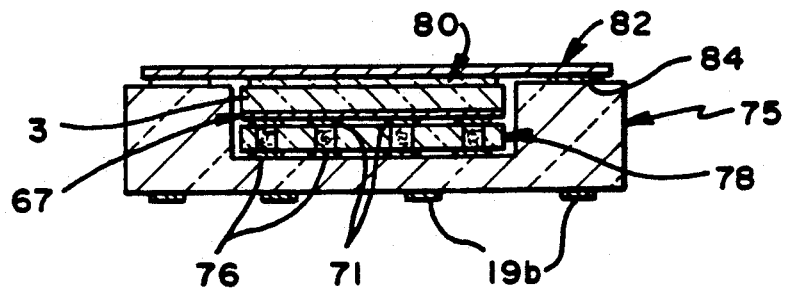
FIG. 9 is a cross-sectional side view of the novel integrated circuit package illustrated in FIG. 8 as it would appear when completely assembled together.

With reference now to FIGS. 8 and 9, the novel integrated circuit package 65 which forms the first embodiment of the invention is provided with a modified package housing 75 having an internal array of connector pads 76 located on the floor of the cavity 5 which are registerable with the pads 71 of the fanout interface 67. These arrays of pads 71 and 76 are advantageously electrically connected by means of a die-connecting interface 78 which is essentially identical in structure to the previously described connecting interface 55. A thermally conductive spacer 80 is applied over the heat transfer side 11 of the rectangular substrate 3 of the integrated circuit die 2, and when the novel integrated circuit package 65 is assembled into the configuration illustrated in FIG. 9, a metallic heat-conductive lid 82 is hermetically sealed around the perimeter of the package housing 75 in compressive engagement against the thermally conductive spacer 80. Such compressive engagement resiliently compresses the button connectors 59 into positive, conductive engagement against the external array of pads 71 of the fanout interface 67, and the internal array of connector pads 76 located on the floor of the cavity 5 of the package housing 75. The "cavity up" configuration of the components in the novel integrated circuit package 65 allows the connector pads 19b at the bottom of the package housing 75 to be advantageously configured into an area-type array, while the thermally conductive spacer 80 and heat conductive lid 82 provides all the thermal dissipation advantages associated with the previously described "cavity down" configuration.

Figure 10:
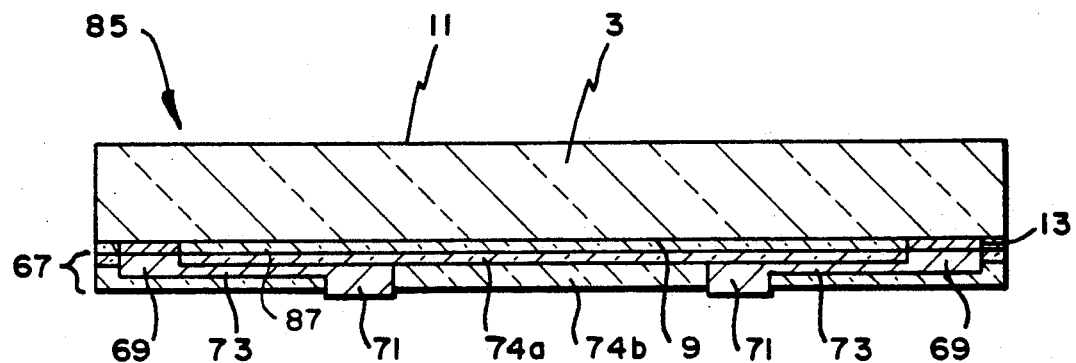
FIG. 10 is a cross-sectional side view of an integrated circuit die wherein a passivation coating is used to hermetically seal the exposed metallization on the die in lieu of a package housing.
Figure 11:
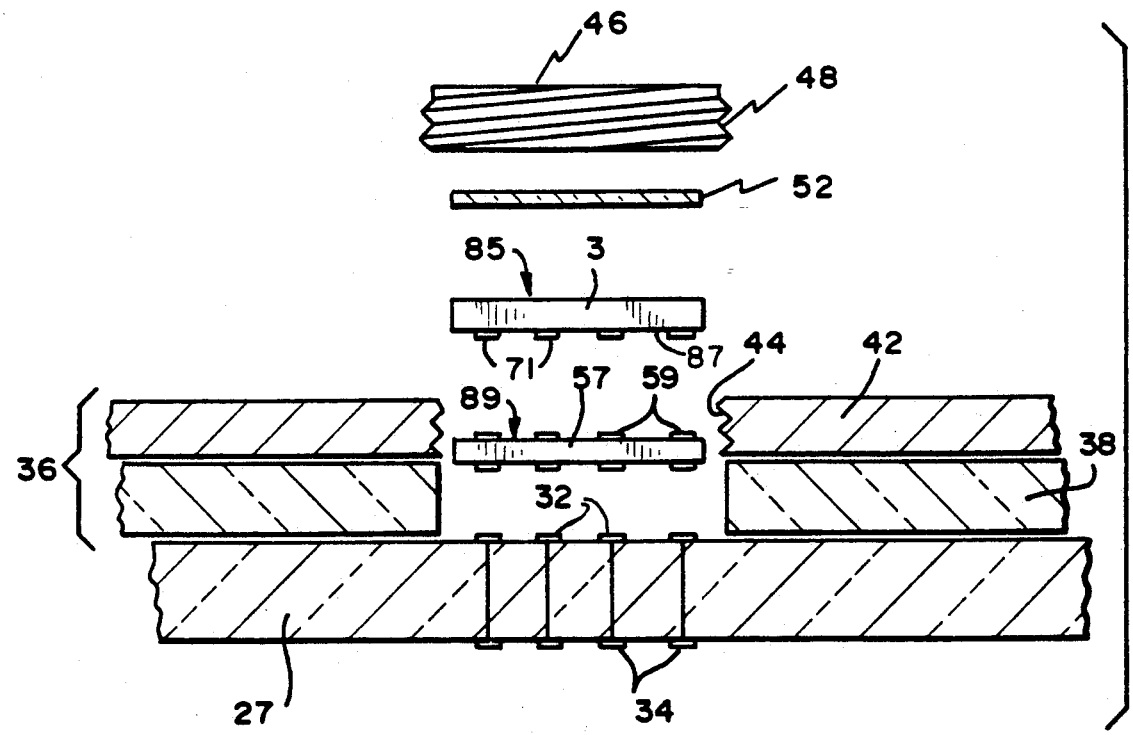
FIG. 11 is an exploded, cross-sectional side view illustrating how the integrated circuit die illustrated in FIG. 10 may be directly mechanically and electrically connected to the PWB module illustrated in FIG. 3 without the need for a package housing.

FIGS. 10 and 11 illustrate a second embodiment of the system of the invention which utilizes a modified die 85 which includes not only the previously described fanout interface 67, but a passivation coating 87 over the metallized side 9 of the substrate 3 forming the die 85. This passivation coating 87 advantageously obviates the need for a package housing as previously described by hermetically sealing all exposed metallization on the metallized side 9 of the substrate 3 from ambient moisture. In the preferred embodiment, the passivation coating 87 is formed from vapor deposited silicon nitride, although other water-impermeable ceramic materials may be used as well. The use of such a passivation coating 87 not only eliminates the size, weight and bulk associated with a package housing, but further reduces thermal barriers between the heat transfer side 11 of the substrate 3 and the thermally conductive spacer 52 and slug retainer 56 of the PWB module 25. To preserve all the advantages associated with solderless PWB modules, a die-connecting interface 89 is provided between the external array of pads 71 of the fanout interface 67 of the die 85, and the PWB connector pads 32. The structure of the die-connecting interface 89 is essentially the same as the previously-described connecting interface 55.

Figure 13:
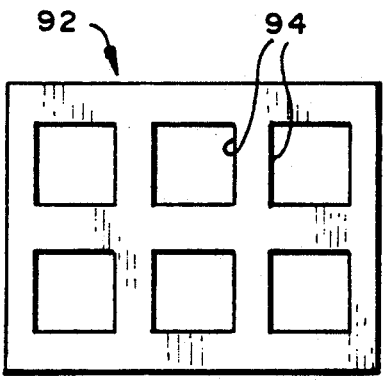
FIG. 13 is a plan view of a special guide plate member used to properly space the plurality of integrated circuit dies illustrated in FIG. 12.
Figure 14:
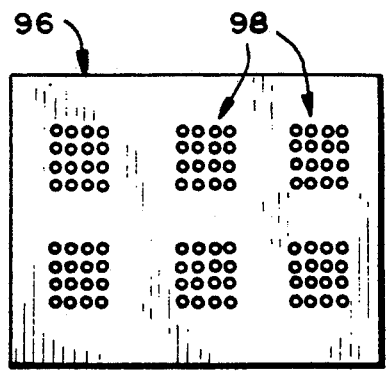
FIG. 14 is a plan view of a special connecting interface used to electrically connect the plurality of integrated circuit dies illustrated in FIG. 12 to a separate interconnection substrate.
Figure 12:
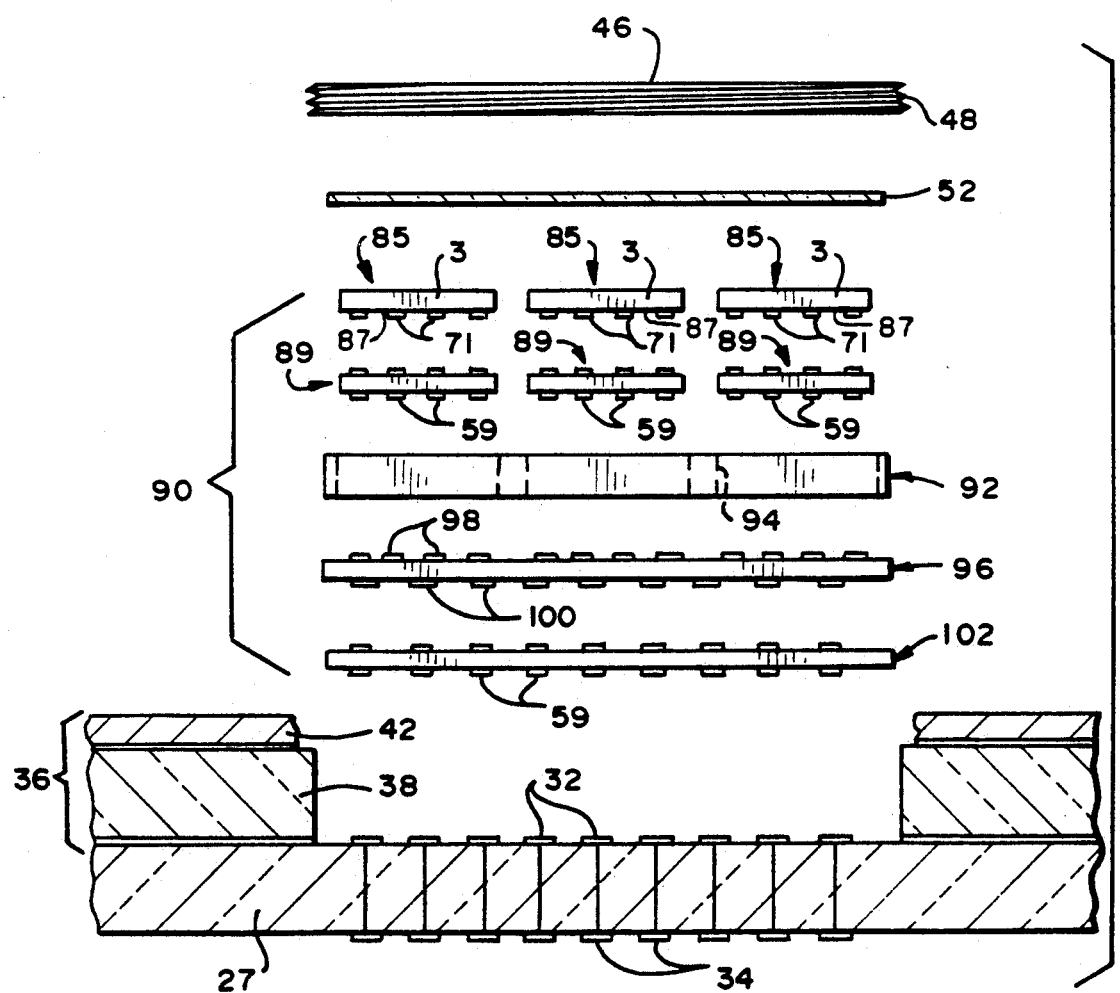
FIG. 12 is an exploded, cross-sectional side view illustrating how a plurality of integrated circuit dies that are interconnected by means of a separate substrate may be directly mechanically and electrically connected to the PWB module illustrated in FIG. 3.
Figure 15:
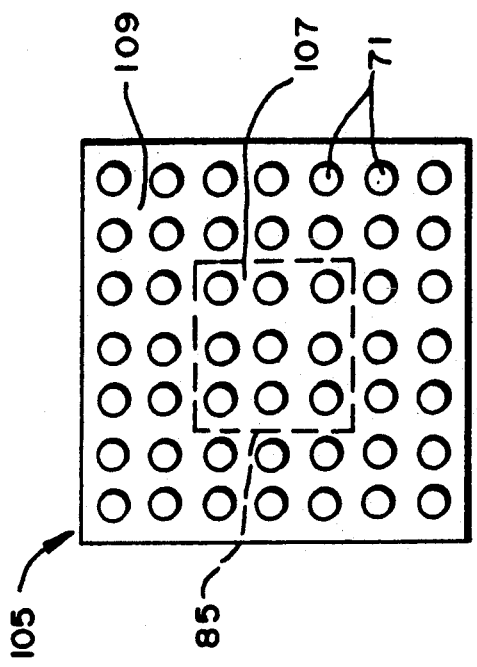
FIG. 15 is a bottom view of another embodiment of the fanout interface which may be used in conjunction with an integrated circuit die, wherein the interface extends beyond the edges of the die.
Figure 16:
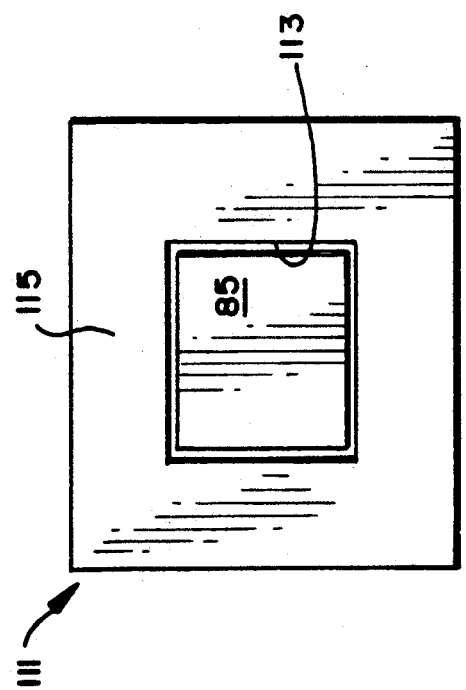
FIG. 16 is a plan view of the integrated circuit die and extended fanout interface illustrated in FIG. 15, which further shows how a rectangular frame may be used to rigidify the portions of the fanout interface that extend over the edges of the die.
Figure 18:
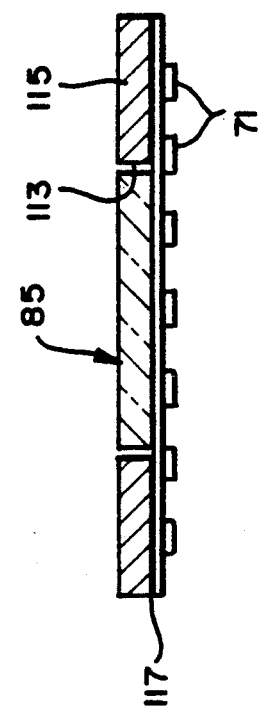
FIG. 18 is a cross-sectional side view of the components illustrated in FIG. 17 shown in assembled form.
Figure 17:
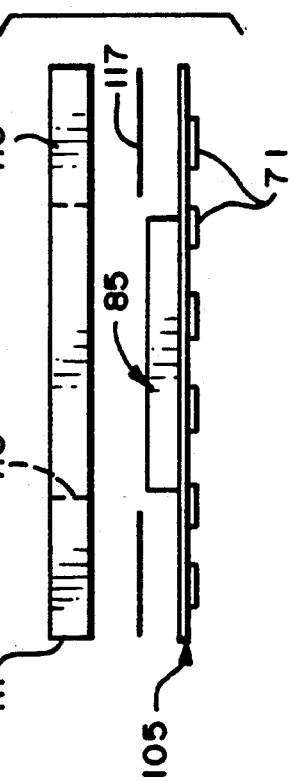
FIG. 17 is an exploded side view of the integrated circuit die, extended fanout interface, and frame member illustrated in FIGS. 15 and 16, showing how these components may be assembled.

FIGS. 12, 13 and 14 illustrate how a circuit sub-assembly 90 may be advantageously constructed utilizing the system of the invention. This circuit sub-assembly 90 is generally formed from a plurality of the previously-described modified dies 85, each of which includes a passivation coating 87 for obviating the need for a package housing. The circuit sub-assembly 90 includes a guide plate member 92 having an array of apertures 94, each of which is matable with one of the previously described modified dies 85. This sub-assembly 90 is also provided with an interconnect substrate 96 which includes an internal wiring configuration (not shown) for interconnecting the plurality of modified dies 85 in conformance with a desired circuit arrangement. Accordingly, the interconnect substrate 96 is formed from an insulating material, such as for example a multilayered co-fired or thick film ceramic, and has an upper array of contact pads 98 which are registerable with the external array of pads 71 of each of the modified dies 85 when these dies 85 are dropped into the apertures 94 of the guide plate member 92. It should be noted that, as a result of this wiring, the lower array of contact pads 100 is normally less numerous and simpler than the upper array 98. Of course, this lower array of contact pads 100 is registerable with the PWB connector pads 32. To positively electrically interconnect the external array of pads 71 of the modified dies 85 with the upper array of contact pads 98 of the interconnect substrate 96, one die-connecting interface 89 as previously described with respect to FIG. 11 is provided for each of the modified dies 85. Moreover, to electrically connect the lower array of contact pads 100 of the interconnect substrate with the PWB connector pads 32, a substrate-connecting interface 102 is provided as shown. The connecting interfaces 89 and 102 are essentially identical in structure to the previously described connecting interface 55. Such a circuit sub-assembly 90 constructed in conformance with the invention is not only lighter in weight and smaller in area than comparable circuit sub-assemblies utilizing one or more ceramic package housings for each of the integrated circuit dies, but is further much simpler to repair, as any of the modified dies 85 may be easily removed from the PWB module 25 by merely unscrewing the slug retainer 46, removing the thermally conductive spacer 52, and withdrawing and replacing one or more of the modified dies 85. Such removal and replacement compares favorably with the prior art, wherein such replacement involved the removal of one or more metallic lids 21 off of the ceramic package housing that contained the die, and the severing and reforming of the delicate bond wires 17 that interconnect the bond pads 13 of the die with the internal contact pads 15 of the package housing 7.

FIGS. 15, 16, 17 and 18 illustrate still another embodiment of the system of the invention which employs an extended fanout interface 105 that is integrally connected to the metallized side 9 of the substrate 3 of either an ordinary die 2 or a die 85 which has been modified by the addition of a passivation coating 87. The extended fanout interface 105 includes a centrally disposed, die-attached portion 107 which is circumscribed by a spillover portion 109 which is not attached to the die 85. The use of such an extended fanout interface 105 advantageously increases the distance between the external array of pads 71 well beyond what this pitch would be if the area of the interface were confined to the area of the metallized side 9 of the substrate 3 of the die 85. Unfortunately however, the spillover portion 109 is not sufficiently rigid for it to make good contact with the resilient electrical connectors 59 of a connecting interface 55. Accordingly, a frame member 111 is provided having an aperture 113 which is tightly matable around the sides of the integrated circuit die 85, and a peripheral portion 116 which is coextensive with the spillover portion 109 of the extended fanout interface 105. A layer of bonding material 117 permanently and securely affixes the top side of the spillover portion 109 to the bottom side of the frame member 111 in order to rigidify it. While the frame member 111 is represented as being formed from metal in the various figures, it may also advantageously be formed from either a ceramic or a plastic material. In use, the combination of the die 85, the extended fanout interface 105, and the frame member 111 would be sandwiched between a connecting interface, and a thermally conductive spacer 52 and slug retainer 46 as previously described.

Figure 19:
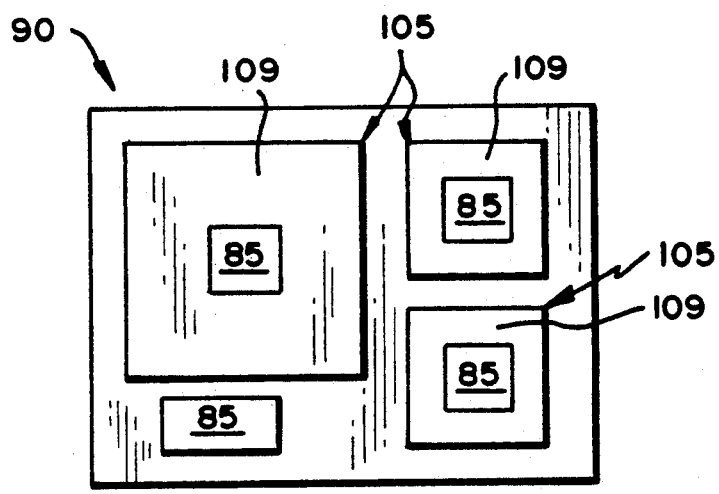
FIG. 19 is a plan view of how a conventional circuit subassembly arrangement might be made of a plurality of integrated circuit dies having fanout interfaces which extend beyond their edges.
Figure 20:
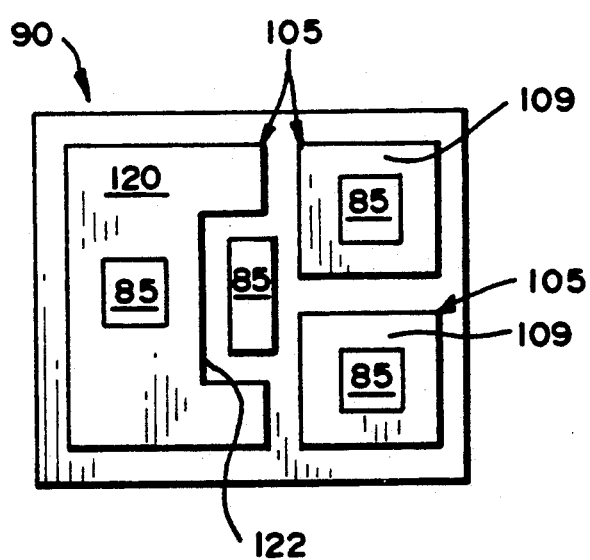
FIG. 20 is a plan view illustrating how the subassembly formed by the integrated circuit dies illustrated in FIG. 19 might be arranged in a compact, area-saving configuration by altering the shape of one or more of the extended fanout interfaces used in conjunction with the dies.

FIGS. 19 and 20 illustrate how a circuit subassembly 90 made from modified dies 85 having extended fanout interfaces 105 may be made smaller and more compact by altering the shape of the spillover portion 109 of the interface 105. More specifically, FIG. 19 represents how the integrated circuit dies 85 would be configured if the spillover portions 109 of the extended fanout interface 105 associated with each of the dies 85 were merely equidistantly extended out around each side of each die 85. By contrast, figure 20 illustrate how the total area required for the circuit sub-assembly 90 may be significantly reduced by providing a spillover portion 120 having a recess 122 which is generally complimentary in shape to one or more of the other components of the sub-assembly. Because the configuration illustrated in FIG. 20 requires less area of PWB board 27 and a lesser area of the various components forming the guide plate assembly 36, this circuit sub-assembly is not only smaller, but is further lighter in weight than the circuit subassembly 90 illustrated in FIG. 19.

I claim:

1. An improved solderless system for electrically and mechanically connecting at least one integrated circuit die to a printed wiring board, wherein said die includes a side having a pattern of bond pads, comprising:
   a. a fanout interface means including a sheet of insulating material having first and second interconnected arrays to contact pads on first and second sides, respectively, said first side of said sheet integrally contacting and substantially covering said bond pad side of said die, and said first array being connected to said bond pads of said die, said second array having a greater pitch between pads than said first array;
   b. a connecting interface means, including an array of resilient electrical connector means for electrically connecting said second pad array of said fanout interface means to another array of contact pads electrically connected to the printed wiring board, and
   c. means for compressing the resilient electrical connector means into conductive engagement between said second and another array of contact pads.

2. The system as defined in claim 1, further comprising a hermetic sealing means for insulating all exposed metallization on said die from moisture.

3. The system as defined in claim 2, wherein said hermetic sealing means includes a passivation coating disposed between said fanout interface means and said die and covering all exposed metallization on said die for obviating the need for containing the integrated circuit die in a package housing.

4. The system as defined in claim 3, wherein said other array of contact pads is mounted directly onto the printed wiring board.

5. The system as defined in claim 3, wherein said system electrically and mechanically connects a plurality of integrated circuit dies to said printed wiring board, and further comprising separate connecting interface means for each die, and an interconnection substrate for electrically interconnecting said dies into a sub-assembly component of said printed wiring board.

6. The system as defined in claim 5, wherein said interconnection substrate includes first and second arrays of contact pads on first and second opposing sides, respectively, wherein said first array engages the resilient electrical connector means of each of said connecting interface means.

7. The system as defined in claim 6, further comprising a second connecting interface means for electrically connecting said second array of said interconnection substrate to a set of contact pads mounted on the printed wiring board.

8. The system as defined in claim 2, wherein said hermetic sealing means includes a package housing having a cavity on one side for receiving said integrated circuit die, an internal contact pad array on the surface of said cavity that is registerable with the second array of said fanout interface means for electrically contacting the same, and an external contact pad array registerable with a set of contact pads mounted on the printed wiring board for electrically contacting the same.

9. The system as defined in claim 8, wherein said connecting interface means is disposed between said internal contact pad array of said package housing and said second array of said fanout interface means for electrically connecting the same, and further comprising a second connecting interface means disposed between said external contact pad array of said package housing and a set of contact pads mounted on the printed wiring board.

10. The system as defined in claim 1, wherein a portion of said fanout interface means extends over said integrated circuit die to create an overlapping portion of said fanout interface means and further comprising a frame means connected to said extended portion for rigidly supporting the same so that the resilient electrical connector means of the connecting interface means positively engage the contact pads on said overlapping portion.

11. An improved solderless system for electrically and mechanically connecting at least one integrated circuit die to a printed wiring board, wherein said die includes a pattern of bond pads along the periphery of one of its sides, comprising:

a fanout interface means including a sheet of insulating material having first and second interconnected arrays of contact pads on first and second sides, respectively, said first side of said sheet integrally contacting and substantially covering said side of said die, and the pads of said first array being electrically connected with said pattern of bond pads, and said second array having an area type pitch;

a connecting interface means including an array of resilient electrical connector means for electrically connecting said second array of said fanout interface means to another array of contact pads electrically connected to the printed wiring board, and a section of insulating, compliant sheet material for holding said connector means;

means for compressing the resilient electrical connector means into engagement between said second and another array of contact pads, and a hermetic sealing means for insulating all exposed metallization of said die from moisture.

12. The system as defined in claim 11, wherein a portion of said fanout interface means overlaps over said integrated circuit die and further comprising a frame means connected to said overlapping portion for rigidly supporting the same so that the resilient electrical connector means of the connecting interface means positively engages the contact pads on said overlapping portion.

13. The system as defined in claim 11, wherein said hermetic sealing means includes a passivation coating disposed between said fanout interface means and said die and covering all exposed metallization on said die and wherein said other array of contact pads is mounted directly onto the printed wiring board without the need for containing the integrated circuit die in a separate package housing.

14. The system as defined in claim 13, further comprising a support plate assembly disposed over said printed wiring board, said plate assembly including an aperture surrounding said array of contact pads mounted directly onto said printed wiring board for receiving said integrated circuit die, said fanout interface means and said connecting interface means.

15. The system as defined in claim 14, wherein said means for compressing the resilient electrical connector means includes a retainer means detachably mountable over said aperture that is thermally connected to said die for conductively transferring heat from said die to the ambient atmosphere.

16. The system as defined in claim 13, wherein said system electrically and mechanically connects a plurality of integrated circuit dies to said printed wiring board, and further comprising separate connecting interface means for each die, and an interconnection substrate for electrically interconnecting said dies into a sub-assembly component of said printed wiring board.

17. The system as defined in claim 16, wherein said interconnection substrate includes first and second arrays of contact pads on first and second opposing sides, respectively, wherein said first array engages the resilient electrical connector means of each of said connecting interface means and further comprising a second connecting interface means for electrically connecting said second array of pads of said interconnection substrate to a set of contact pads mounted on the printed wiring board.

18. The system as defined in claim 11, wherein said hermetic sealing means includes a package housing having a cavity on one side for receiving said integrated circuit die, an internal contact pad array on the surface of said cavity that contacts the second array of said fanout interface means, and an external contact pad array registerable with a set of contact pads mounted on the printed wiring board.

19. The system as defined in claim 18, wherein said connecting interface means is disposed between said internal contact pad array of said package housing and said second array of said fanout interface means for electrically connecting the same, and further comprising a second connecting interface means disposed between said external contact pad array of said package housing and a set of contact pads mounted on the printed wiring board.

20. The system as defined in claim 19, wherein said means for compressing the resilient electrical connector means includes a heat conductive lid means mounted over the cavity in said package housing for conductively transferring heat from said die to the ambient atmosphere.

21. An improved solderless system for electrically and mechanically connecting at least one integrated circuit die to a printed wiring board, wherein the die includes a pattern of bond pads along the periphery of one of its sides, comprising:

a fanout interface means including a sheet of insulating material having first and second arrays of contact pads on first and second sides, respectively, the first side of said sheet integrally contacting and substantially covering the bond pad side of the integrated circuit die, the pads of said first array being registered with said pattern of bond pads and electrically connected thereto, and said second array having an area type array;

a connecting interface means including an array of resilient electrical connector means for electrically connecting said second array of said fanout interface means to an array of contact pads on the printed wiring board, and a section of insulating, compliant sheet material for holding said connector means;

a support plate assembly mounted over said printed wiring board and having an aperture surrounding said array of contact pads electrically connected to said board for receiving a connecting interface means and said fanout interface means of said die in stacked relationship;

means for both compressing the resilient electrical connector means into engagement between said second and other array of contact pads connected to said board, and for conductively transferring heat from said die to the ambient atmosphere, and a hermetic sealing means including a passivation coating applied over all exposed metallization on said die for protecting said metallization from moisture and obviating the need for containing the integrated circuit die in a separate package housing.

22. The system as defined in claim 21, wherein said passivation coating is a layer of vapor-deposited silicon nitride.

23. An improved system for electrically interconnecting a plurality of integrated circuit dies into a subassembly and for electrically and mechanically connecting said subassembly to a printed wiring board, comprising:

a fanout interface means for each of said dies, each of which includes a sheet of insulating material having first and second interconnected arrays of contact pads on first and second sides, respectively, said first array being connected to the bond pads of said die;

an interconnection substrate having a first pattern of contact pads on a first side that is registerable with the second array of contact pads of each of said fanout interface means, a plurality of internal conductors for interconnecting said dies into a subassembly, and a second pattern of contact pads on a second side that is registerable with a set of contact pads mounted directly on the printed wiring board;

at least one first connecting interface means disposed between said dies and said first side of said substrate and having an array of resilient electrical connector means for electrically connecting said second array of pads of said fanout interface means to said first pattern of contact pads on said substrate;

a second connecting interface means disposed between said substrate and said printed wiring board and having an array of resilient electrical connector means for electrically connecting said second pattern of contact pads to said set of printed wiring board contact pads, and means for compressing the resilient electrical connector means of said first and second connecting interface means into conductive engagement between said second array and first pattern of contact pads and said second pattern of contact pads and said printed wiring board contact pads.

24. The system as defined in claim 23, further comprising a heat conductive spacer between said compressing means and said dies.

25. The system as defined in claim 23, wherein a portion of at least two of the fanout interface means of two dies extends over a side of its respective die, and wherein the extended portions,-of said fanout interface means surround the die to reduce the total area required by the resulting subassembly.

26. An improved solderless system for electrically and mechanically connecting at least one integrated circuit die to a printed wiring board, wherein sid die having a side that includes a pattern of bond pads along its edges, comprising:

a fanout interface means including a sheet of insulating material having first and second interconnected arrays of contact pads on first and second sides, respectively, said first side of said sheet material integrally contacting and substantially covering said bond pad side of said die, and first array of pads being connected to said bond pads of said die, and said second array of bond pads being arranged in an area array;

a package housing having a cavity on one side for receiving an integrated circuit die, an internal contact pad array on the surface of said cavity that is registerable with the contact pad array of the die, and an external area-type contact array on an opposite side of said housing;

a connecting interface means disposed between said fanout interface means and said cavity and including an array of resilient electrical connector means for electrically connecting said second array of pads of said fanout interface means with sid internal contact pads of such housing, and lid means affixed over the cavity in the package housing for compressing the resilient electrical connector means into engagement between said fanout interface contact pads and cavity contact pads for hermetically sealing said package housing.

27. The system as defined in claim 26 wherein said lid means is heat conductive for conductively transferring heat from said die.

* * * * *